(12) United States Patent
Lin

(10) Patent No.: US 12,466,019 B2
(45) Date of Patent: Nov. 11, 2025

(54) SILICON CARBIDE WAFER AND METHOD OF FORMING THE SAME

(71) Applicant: GlobalWafers Co., Ltd., Hsinchu (TW)

(72) Inventor: Ching-Shan Lin, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 19/008,639

(22) Filed: Jan. 3, 2025

(65) Prior Publication Data

US 2025/0223724 A1  Jul. 10, 2025

Related U.S. Application Data

(60) Provisional application No. 63/619,316, filed on Jan. 10, 2024.

(51) Int. Cl.
| | | |
|---|---|---|
| B32B 3/00 | (2006.01) |
| B24B 5/50 | (2006.01) |
| B28D 1/22 | (2006.01) |
| C30B 23/00 | (2006.01) |
| C30B 23/02 | (2006.01) |
| C30B 23/06 | (2006.01) |
| C30B 28/02 | (2006.01) |
| C30B 28/14 | (2006.01) |
| C30B 29/36 | (2006.01) |
| C30B 29/60 | (2006.01) |
| C30B 33/00 | (2006.01) |
| H01L 21/02 | (2006.01) |

(52) U.S. Cl.
CPC .......... *B24B 5/50* (2013.01); *B28D 1/22* (2013.01); *B32B 3/00* (2013.01); *C30B 23/002* (2013.01); *C30B 23/02* (2013.01); *C30B 23/06* (2013.01); *C30B 28/02* (2013.01); *C30B 28/14* (2013.01); *C30B 29/36* (2013.01); *C30B 29/60* (2013.01); *C30B 33/00* (2013.01); *H01L 21/02013* (2013.01)

(58) Field of Classification Search
CPC ...................................................... C30B 29/36
See application file for complete search history.

(56) References Cited

U.S. PATENT DOCUMENTS

| | | |
|---|---|---|
| 7,422,634 B2 | 9/2008 | Powell et al. |
| 9,287,121 B2 | 3/2016 | Momose et al. |
| 2019/0106811 A1 | 4/2019 | Lin et al. |

(Continued)

FOREIGN PATENT DOCUMENTS

| | | |
|---|---|---|
| CN | 104813439 | 7/2015 |
| CN | 107532327 | 1/2018 |

(Continued)

OTHER PUBLICATIONS

"Office Action of Taiwan Counterpart Application", issued on Aug. 6, 2025, p. 1-p. 7.

*Primary Examiner* — Elizabeth E Mulvaney
(74) *Attorney, Agent, or Firm* — JCIPRNET

(57) ABSTRACT

A silicon carbide wafer having a seed end and a dome end opposite to the seed end. In the silicon carbide wafer, a basal plane dislocation (BPD) density detected by potassium hydroxide (KOH) etching is less than 550 pcs/cm$^2$ at both the seed end and the dome end, and a basal plane dislocation (PL-BPD) density detected by photoluminescence is less than 2000 pcs/cm$^2$ at both the seed end and the dome end.

14 Claims, 3 Drawing Sheets

(56) References Cited

U.S. PATENT DOCUMENTS

| | | |
|---|---|---|
| 2021/0189591 A1 | 6/2021 | Xu et al. |
| 2022/0106703 A1* | 4/2022 | Shen ................ C30B 15/14 |
| 2023/0243064 A1* | 8/2023 | Wellmann ........... C30B 23/02 |
| | | 117/84 |
| 2024/0011185 A1* | 1/2024 | Lin ................ C30B 23/002 |
| 2024/0011187 A1* | 1/2024 | Lin ................ C30B 23/002 |
| 2024/0011188 A1* | 1/2024 | Lin ................ C30B 23/025 |
| 2024/0011190 A1* | 1/2024 | Lin ................ C30B 23/002 |

FOREIGN PATENT DOCUMENTS

| | | |
|---|---|---|
| CN | 104246023 | 2/2019 |
| TW | 202204256 | 2/2022 |

\* cited by examiner

SILICON CARBIDE WAFER AND METHOD OF FORMING THE SAME

CROSS-REFERENCE TO RELATED APPLICATION

This application claims the priority benefit of U.S. provisional application Ser. No. 63/619,316, filed on Jan. 10, 2024. The entirety of the above-mentioned patent application is hereby incorporated by reference herein and made a part of this specification.

BACKGROUND

Technical Field

This disclosure relates to a silicon carbide wafer, and in particular to a silicon carbide wafer and a method of forming the same.

Description of Related Art

Silicon carbide (SiC) is a wide-band-gap semiconductor material. Silicon carbide has many remarkable physical properties that make it a major component in today's high-power, high-temperature, and high-frequency electronics.

Silicon carbide (SiC) crystal growth is not easy and defects can seriously affect the performance of SiC devices. Some of the major defects in silicon carbide (SiC), as far as the current technology is concerned, include threading screw dislocations (TSD), threading edge dislocations (TED), and basal plane dislocations (BPD), which are detected by etching methods. However, only considering the defects of TSD, TED, and BPD will not result in good quality, which in turn will affect the yield.

In addition to the consideration of TSD, TED and BPD, how to completely analyze the quality of silicon carbide crystals and wafers may be an urgent problem that needs to be solved.

SUMMARY

The disclosure provides a silicon carbide wafer and a method of forming the same. By further considering a basal plane dislocation (PL-BPD) density detected by photoluminescence, a more complete quality analysis of silicon carbide crystals and wafers can be provided.

The silicon carbide wafer of the disclosure has a seed end and a dome end opposite to the seed end. In the silicon carbide wafer, a basal plane dislocation (BPD) density detected by potassium hydroxide (KOH) etching is less than 550 pcs/cm² at both the seed end and the dome end, and a basal plane dislocation (PL-BPD) density detected by photoluminescence is less than 2000 pcs/cm² at both the seed end and the dome end.

In some embodiments, for the basal plane dislocation (BPD) density detected by potassium hydroxide (KOH) etching, a difference ratio D of a first base plane dislocation density BPD1 at the seed end to a second base plane dislocation density BPD2 at the dome end is required to satisfy the following equation (1):

$$D = (BPD1 - BPD2)/BPD1 \le 26\%. \quad (1)$$

In some embodiments, for the basal plane dislocation (PL-BPD) density detected by photoluminescence, a difference ratio PL-D of a first base plane dislocation density PL-BPD1 at the seed end to a second base plane dislocation density PL-BPD2 at the dome end is required to satisfy the following equation (2):

$$PL - D = (PL - BPD1 - PL - BPD2)/PL - BPD1 \le 16\%. \quad (2)$$

In some embodiments, the difference ratio PL-D of the first base plane dislocation density PL-BPD1 at the seed end to the second base plane dislocation density PL-BPD2 at the dorm end is 14% or less.

In some embodiments, the difference ratio PL-D of the first base plane dislocation density PL-BPD1 at the seed end to the second base plane dislocation density PL-BPD2 at the dorm end is 12% or less.

In some embodiments, the difference ratio PL-D of the first base plane dislocation density PL-BPD1 at the seed end to the second base plane dislocation density PL-BPD2 at the dorm end is 10% or less.

In some embodiments, the basal plane dislocation (BPD) density detected by the potassium hydroxide (KOH) etching is less than 200 pcs/cm² at both the seed end and the dome.

In some embodiments, the basal plane dislocation (PL-BPD) density detected by the photoluminescence is less than 1000 pcs/cm² at both the seed end and the dome end.

In some embodiments, a wafer diameter of the silicon carbide wafer is 150 mm, 200 mm, or 300 mm.

In some embodiments, the silicon carbide wafer has a through-spiral dislocation (TSD) density of 5 pcs/cm² or less, a bar stacking fault (BSF) density of 5 pcs/wafer or less, and a stacking fault (SF) density of 5 pcs/wafer or less.

In some embodiments, a warp of the silicon carbide wafer is less than 40 µm, a bow is within a range of +/−20 µm, and a triangle defect density is less than 0.1 pcs/cm².

The disclosure provides a method of forming a silicon carbide wafer that includes the following. A raw material containing a carbon element and a silicon element and a seed crystal located above the raw material are provided in a reactor. A growth process of silicon carbide crystal is performed, in which the growth process includes heating the reactor and the raw material to form a silicon carbide crystal on the seed crystal. In the growth process, an axial temperature gradient (ΔTz) of the silicon carbide crystal is controlled in a range of 20° C./cm to 150° C./cm, and a radial temperature gradient (ΔTx) of the silicon carbide crystal is controlled in a range of 10° C./cm to 100° C./cm. After the silicon carbide crystal is sliced and polished, a silicon carbide wafer is obtained.

In some embodiments, in the growth process, the axial temperature gradient (ΔTz) of the silicon carbide crystal is controlled to be in a range of 20° C./cm to 100° C./cm, and the radial temperature gradient (ΔTx) of the silicon carbide crystal is controlled to be in a range of 10° C./cm to 80° C./cm.

In some embodiments, a temperature gradient difference (ΔTz−ΔTx) between the axial temperature gradient and the radial temperature gradient of the silicon carbide crystal is in a range of 10° C./cm to 50° C./cm.

Based on the above, by considering the basal plane dislocation (PL-BPD) density detected by photoluminescence and the basal plane dislocation (BPD) density detected by potassium hydroxide (KOH) etching, the quality of the silicon carbide crystals and wafers can be analyzed completely, and the silicon carbide crystals and wafers with extremely low defects can be screened out to obtain a better epitaxial quality yield.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate example embodiments of the disclosure and, together with the description, serve to explain the principles of the disclosure.

DESCRIPTION OF THE EMBODIMENTS

Figure 1:
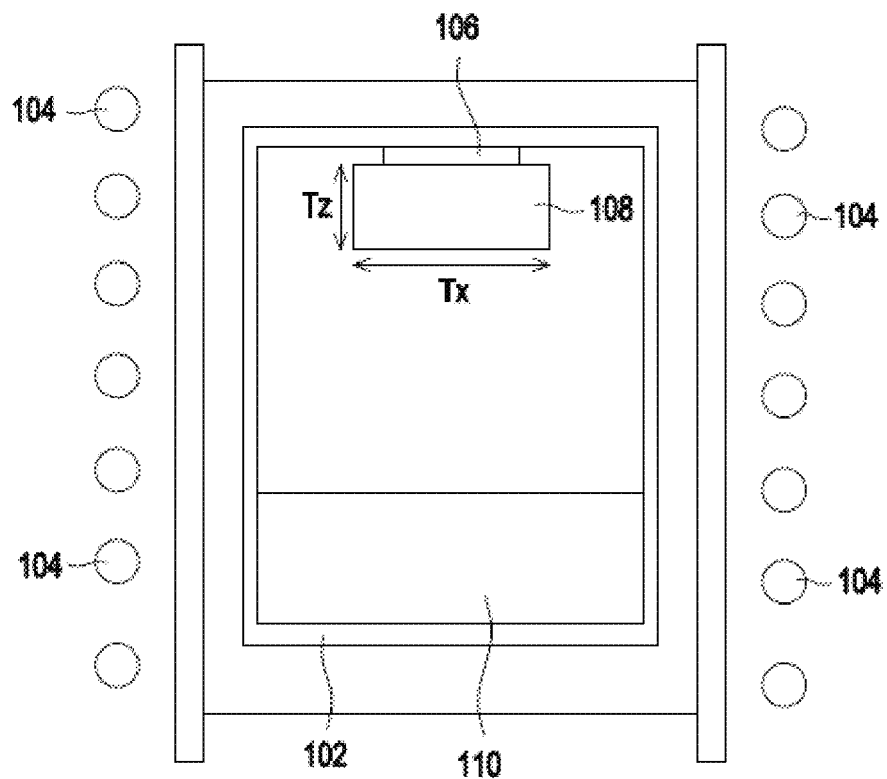
FIG. 1 is a schematic diagram of a crystal growth equipment according to an embodiment of the disclosure.
Figure 2A:
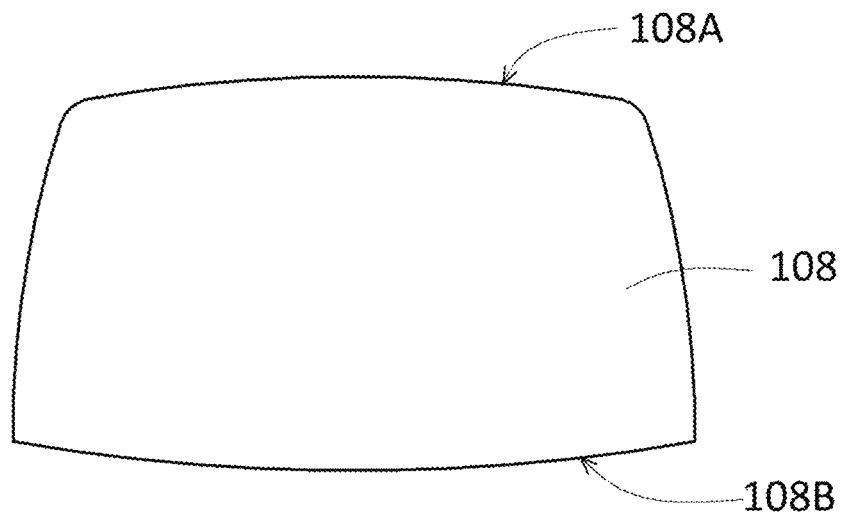
FIG. 2A to FIG. 2C are schematic cross-sectional diagrams of a method of forming a silicon carbide wafer according to some embodiments of the disclosure.
Figure 2B:
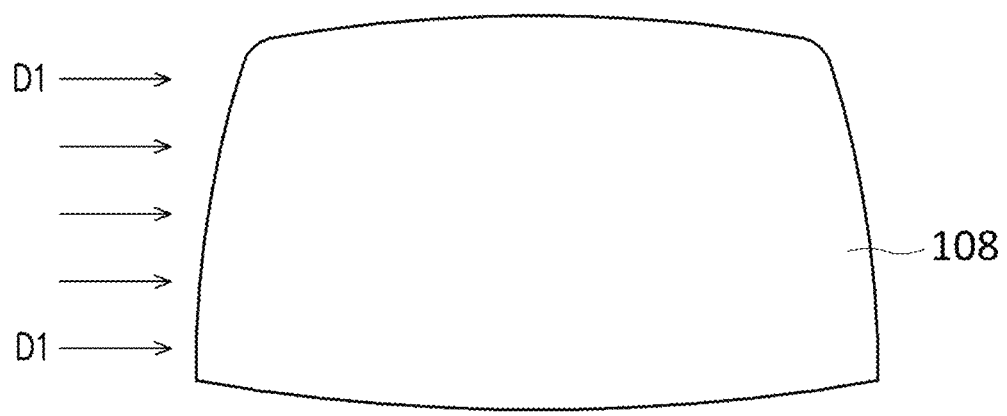
Figure 2C:
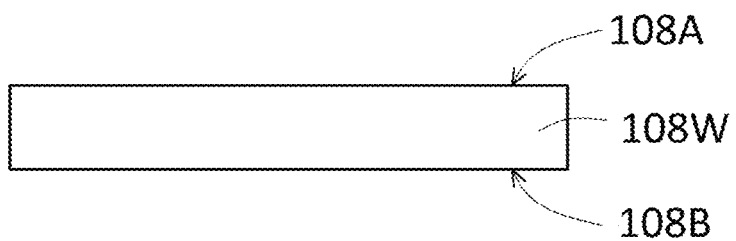
Figure 3:
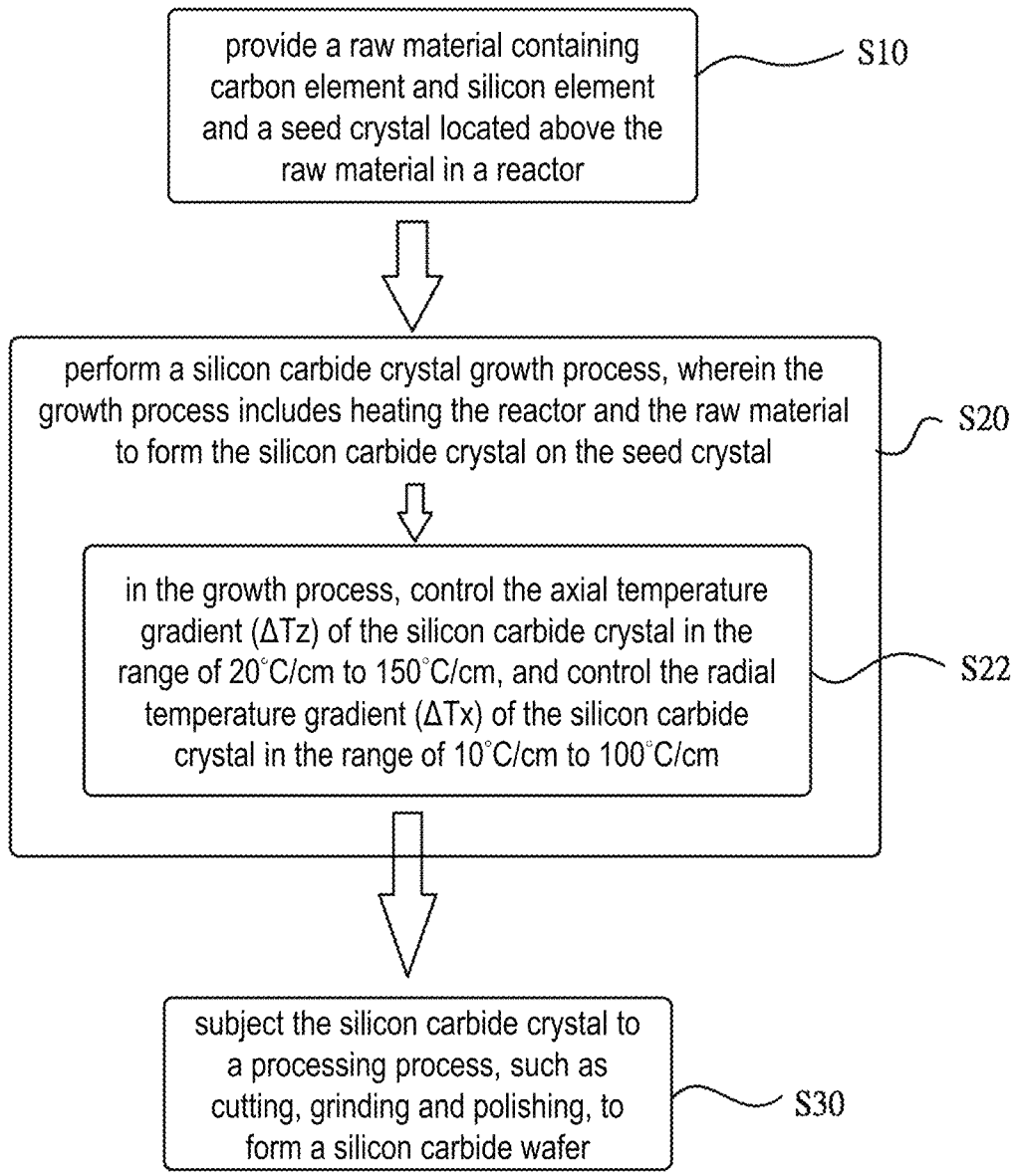
FIG. 3 is a flow chart of a method of forming a silicon carbide wafer according an embodiment of the disclosure.

FIG. 1 is a schematic diagram of a crystal growth equipment according to an embodiment of the disclosure. FIG. 2A to FIG. 2C are schematic cross-sectional diagrams of a method of forming a silicon carbide wafer according to some embodiments of the disclosure. FIG. 3 is a flow chart of a method of forming a silicon carbide wafer according an embodiment of the disclosure. Hereinafter, the method of forming silicon carbide crystals in some embodiments of the disclosure is described with reference to the crystal growth equipment shown in FIG. 1 in conjunction with the schematic cross-sectional diagrams of FIG. 2A to FIG. 2C and the flow chart of FIG. 3.

As shown in step S10 of FIG. 1 and FIG. 3, in the method of forming the silicon carbide crystal according to the embodiment of the disclosure, a raw material 110 containing carbon element and silicon element and a seed crystal 106 located above the raw material 110 are provided in a reactor 102. For example, the raw material 110 is silicon carbide powder, which is placed at the bottom of the reactor 102 as a solid sublimation source. The seed crystal 106 is disposed at the top of the reactor 102. In some embodiments, the seed crystal 106 can be fixed on a seed crystal carrying platform (not shown) through an adhesive layer. The material of the seed crystal 106 includes silicon carbide. For example, the seed crystal 106 is 6H silicon carbide or 4H silicon carbide. In other embodiments, the seed crystal 106 includes 6H silicon carbide and 4H silicon carbide.

As shown in step S20 of FIG. 1 and FIG. 3, a silicon carbide crystal growth process is performed to form a silicon carbide crystal 108 as shown in FIG. 2A. For example, the growth process includes heating the reactor 102 and the raw material 100 to form the silicon carbide crystal 108 on the seed crystal 106. In some embodiments, the growth process further includes step S22 to control the axial temperature gradient ($\Delta Tz$) of the silicon carbide crystal 108 in the range of 20° C./cm to 150° C./cm, and to control the radial temperature gradient ($\Delta Tx$) of the silicon carbide crystal in the range of 10° C./cm to 100° C./cm to form the silicon carbide crystal 108.

In the above steps S20 and S22, the silicon carbide crystal 108 is formed on the seed crystal 106 by physical vapor transport (PVT). In some embodiments, an induction coil 104 is used to heat the reactor 102 and the raw material 110 to form the silicon carbide crystal 108 on the seed crystal 106. During the process, the seed crystal 106 receives the raw material 110 (silicon carbide powder) solidified from the gaseous state, and the semiconductor crystals slowly grow on the seed crystal 106 until the silicon carbide crystal 108 with the desired size is obtained. Next, referring to FIG. 1 and step S30 of FIG. 2, after the silicon carbide crystal 108 grows to a desired size, the reactor 102 and the raw material 110 are cooled to obtain silicon carbide ingot composed of the silicon carbide crystal 108. In some embodiments, the formed ingots may have different crystal structures depending on the crystal orientation of the single crystal seed used. For example, the ingot of the silicon carbide includes 4H-silicon carbide, 6H-silicon carbide, etc. Both 4H-silicon carbide and 6H-silicon carbide belong to the hexagonal crystal system.

In the above embodiment, when the reactor 102 and the raw material 110 are heated to form the silicon carbide crystal 108, the axial temperature gradient ($\Delta Tz$) refers to the temperature gradient of the silicon carbide crystal 108 in the thickness direction, and the radial temperature gradient ($\Delta Tx$) refers to the temperature gradient of the silicon carbide crystal 108 in the horizontal direction perpendicular to the thickness direction. For example, by measuring the temperature change in the entire axial (thickness) range, or the temperature change in the entire radial (width or radius direction) range, the axial or radial "temperature/per unit length" (such as ° C./cm) can be obtained. In some embodiments, conventional methods such as infrared thermography can be used to measure the axial and axial temperature gradients. Moreover, in some embodiments, the difference in growth rate in each crystal orientation is used to adjust the temperature difference between the axial direction and the radial direction, so as to control the axial temperature gradient and the radial temperature gradient within a specific range. For example, the growth rate in the <11-20> crystal orientation and the growth rate in the <1-100> crystal orientation can be controlled so that the crystals in each axial/radial direction achieve specific growth rates to adjust the axial temperature gradient ($\Delta Tz$) and radial temperature gradient ($\Delta Tx$).

As mentioned in step S22, during the crystal growth process, the axial temperature gradient ($\Delta Tz$) of the silicon carbide crystal 108 is controlled to be in the range of 20° C./cm to 150° C./cm, and the radial temperature gradient ($\Delta Tx$) of the silicon carbide crystal is controlled to be in the range of 10° C./cm to 100° C./cm. In a specific embodiment, the axial temperature gradient ($\Delta Tz$) of the silicon carbide crystal is controlled to be in the range of 20° C./cm to 100° C./cm, and the radial temperature gradient ($\Delta Tx$) of the silicon carbide crystal is controlled to be in the range of 10° C./cm to 80° C./cm. In addition, in some embodiments, the temperature gradient difference ($\Delta Tz-\Delta Tx$) between the axial temperature gradient ($\Delta Tz$) and the radial temperature gradient ($\Delta Tx$) of the silicon carbide crystal 108 during the growth process is in the range of 10° C./cm to 50° C./cm. When the axial temperature gradient ($\Delta Tz$), the radial temperature gradient ($\Delta Tx$), and temperature gradient difference ($\Delta Tz-\Delta Tx$) are controlled within the above range, the formed silicon carbide crystal 108 may have lower defects and better epitaxial quality yield.

Next, referring to step S30 of FIG. 3 and as shown in FIG. 2A and FIG. 2B, the silicon carbide ingot (silicon carbide crystal 108) obtained through the crystal growth process is subjected to a processing process, such as cutting, grinding and polishing, to form a silicon carbide wafer 108W. As shown in FIG. 2A, the silicon carbide crystal 108 can be removed from the reactor 102. The thickness of the formed silicon carbide crystal 108 is in the range of 10 mm to 100 mm, for example, in the range of 80 mm to 100 mm, or in the range of 20 mm to 60 mm. The silicon carbide crystal 108 includes a first surface 108A and a second surface 108B opposite to the first surface 108A. The first surface 108A is, for example, a carbon surface (or dome end), and the second surface 108B is, for example, a silicon surface (or seed end).

Next, as shown in FIG. 2B, the silicon carbide crystal 108 is processed. For example, the silicon carbide crystal 108 is cut and rounded into equal-diameter cylinders to avoid cracking of the corners of the crystal due to collision and to facilitate subsequent processes. Next, the silicon carbide crystal 108 is sliced along a first direction D1 to separate multiple wafers. The silicon carbide crystal 108 can be sliced by cutting with a knife or wire with abrasive grains (e.g., diamond particles) or by laser cutting. After slicing and grinding and polishing the silicon carbide crystal 108, multiple silicon carbide wafers 108W as shown in FIG. 2C can be obtained. The silicon carbide wafer 108W also has a first surface 108A (carbon surface or dome end) and a second surface 108B (silicon surface or seed end) opposite to the first surface 108A. In addition, the wafer diameter of the silicon carbide wafer 108W obtained by the above method is greater than 150 mm, and is, for example, 150 mm, 200 mm or 300 mm.

After obtaining the silicon carbide wafer 108W, its basal plane dislocation (BPD) density, photoluminescence basal plane dislocation (PL-BPD) density, through-spiral dislocation (TSD) density, and bar stacking fault (BSF) density, and the stacking fault (SF) density are analyzed. In the embodiment of the disclosure, the analysis of basal plane dislocation (BPD) density is destructive analysis using etching. In some embodiments, potassium hydroxide (KOH) is used to perform wafer etching at 500° C., and then an instrument such as automated optical inspection (AOI) is used to calculate the BPD number density. In some embodiments, the basal plane dislocation (BPD) density detected by potassium hydroxide (KOH) etching is less than 550 pcs/cm$^2$ at both the seed end (second surface 108B) and the dome end (first surface 108A) of the silicon carbide wafer 108W. In a specific embodiment, the basal plane dislocation (BPD) density detected by potassium hydroxide (KOH) etching is less than 200 pcs/cm$^2$ at both the seed end (second surface 108B) and the dome end (first surface 108A).

In addition, for the basal plane dislocation (BPD) density detected by potassium hydroxide (KOH) etching, a difference ratio D of a first base plane dislocation density BPD1 at the seed end (second surface 108B) of the silicon carbide wafer 108W to a second base plane dislocation density BPD2 at the dome end (the first surface 108A) is required to satisfy the following equation (1):

$$D = (BPD1 - BPD2)/BPD1 \leq 26\%. \quad (1)$$

In some embodiments, the difference ratio D of the first basal plane dislocation density BPD1 at the seed end (second surface 108B) to the second basal plane dislocation density BPD2 at the dome end (first surface 108A) is less than 26%, and is, for example, 3% to 26% or 10% to 20%.

In the embodiment of the disclosure, the analysis of the photoluminescence basal plane dislocation (PL-BPD) density is a non-destructive analysis using photoluminescence detection. For example, UV light is used to irradiate the wafer to excite fluorescence, and then a detector is used to receive the amount of fluorescence and convert it into a numerical value of the number density of PL-BPD. For example, the UV light wavelength of photoluminescence is 313 nm, 316 nm, 350 nm, 365 nm, or 385 nm. In a specific embodiment, the UV light wavelength is 316 nm or 365 nm.

In some embodiments, the basal plane dislocation (PL-BPD) density detected by photoluminescence is less than 2000 pcs/cm$^2$ at both the seed end (second surface 108B) and the dome end (first surface 108A) of the silicon carbide wafer 108W. In a specific embodiment, the basal plane dislocation (PL-BPD) density detected by photoluminescence is less than 1000 pcs/cm$^2$ at both the seed end (second surface 108B) and the dome end (first surface 108A) of the silicon carbide wafer 108W.

In addition, for the basal plane dislocation (PL-BPD) density detected by photoluminescence, a difference ratio PL-D of a first base plane dislocation density PL-BPD1 at the seed end (second surface 108B) of the silicon carbide wafer 108W to a second base plane dislocation density PL-BPD2 at the dome end (the first surface 108A) is required to satisfy the following equation (2):

$$PL - D = (PL - BPD1 - PL - BPD2)/PL - BPD1 \leq 16\%. \quad (2)$$

In some embodiments, the difference ratio PL-D of the first basal plane dislocation density PL-BPD1 at the seed end (second surface 108B) to the second basal plane dislocation density PL-BPD2 at the dome end (first surface 108A) is 16% or less, and is, for example, 3% to 15% or 3% to 10%. In a specific embodiment, the difference ratio PL-D is 15% or less, 14% or less, 12% or less, or 10% or less.

In the embodiment of the disclosure, the through-spiral dislocation (TSD) density of the obtained silicon carbide wafer 108W is 5 pcs/cm$^2$ or less, the bar stacking fault (BSF) density is 5 pcs/wafer or less, and the stacking fault (SF) density is 5 pcs/wafer or less.

When controlling the method of forming the silicon carbide wafer 108W, the basal plane dislocation (BPD) density, the photoluminescence basal plane dislocation (PL-BPD) density, the through-spiral dislocation (TSD) density, the bar stacking fault (BSF) density, and stacking fault (SF) density are controlled within the above range, and the silicon carbide crystal 108 may have better quality and better epitaxial quality yield. For example, in the wafer geometric yield analysis, the warp of the silicon carbide wafer 108W is less than 40 μm, the bow is within the range of +/−20 μm, and the triangle defect density of the epitaxial wafer is less than 0.1 pcs/cm$^2$.

EMBODIMENTS

In order to demonstrate the importance of considering not only BPD, TSD, BSF, and SF defects in the silicon carbide wafer 108W, but also photoluminescence basal plane dislocation PL-BPD density defects, the following embodiments are used as illustration.

In this embodiment, as shown in the above steps of FIG. 1 to FIG. 3, the axial temperature gradient (ΔTz), the radial temperature gradient (ΔTx), and temperature gradient difference (ΔTz-ΔTx) in the crystal growth process are controlled as shown in Table 1 below to form silicon carbide crystals with specific crystal thickness (in the range of 10 mm to 100 mm). Next, after the silicon carbide crystal is sliced and ground and polished to obtain the silicon carbide wafer, the defects of BPD, TSD, BSF, SF and PL-BPD in the silicon carbide wafer are analyzed respectively and their effects on the wafer geometrical yields are confirmed. In this embodiment, the wafer diameter of the silicon carbide wafer obtained is 200 mm. Detailed experimental results are shown in Table 1 below.

when the BPD density of the seed end and dome end of the wafer is less than 550 pcs/cm$^2$, the PL-BPD density is less than 2000 pcs/cm$^2$, the TSD density is 5 pcs/cm$^2$ or less, the BSF density is 5 pcs/wafer or less, and the SF density is 5 pcs/wafer or less, the wafer geometric yield of the formed silicon carbide wafer is evaluated as good (G). That is, the

TABLE 1

| | control group 1 | control group 2 | control group 3 | Embodiment 1 | Embodiment 2 | Embodiment 3 | Embodiment 4 | Embodiment 5 | Embodiment 6 |
|---|---|---|---|---|---|---|---|---|---|
| Crystal growth process | | | | | | | | | |
| axial temperature gradient ($\Delta Tz$) (° C./cm) | 130 | 160 | 180 | 150 | 140 | 100 | 80 | 20 | 60 |
| radial temperature gradient ($\Delta Tx$) (° C./cm) | 125 | 50 | 110 | 100 | 95 | 80 | 65 | 10 | 40 |
| temperature gradient difference ($\Delta Tz - \Delta Tx$) (° C./cm) | 5 | 110 | 70 | 50 | 45 | 20 | 15 | 10 | 20 |
| crystal thickness (mm) | 25 | 23 | 24 | 95 | 85 | 43 | 55 | 63 | 34 |
| Analysis of defects in silicon carbide wafer | | | | | | | | | |
| seed end BPD1 (ea/cm$^2$) | 118 | 286 | 386 | 530 | 421 | 89 | 47 | 32 | 23 |
| dome end BPD2 (ea/cm$^2$) | 109 | 235 | 302 | 453 | 332 | 71 | 38 | 27 | 20 |
| difference ratio D:(%) | 8% | 18% | 22% | 15% | 21% | 20% | 19% | 16% | 13% |
| seed end PL-BPD1 (ea/cm$^2$) | 2512 | 3653 | 2858 | 1998 | 1213 | 782 | 421 | 352 | 202 |
| dome end PL-BPD2 (ea/cm$^2$) | 2020 | 2102 | 2213 | 1702 | 1045 | 685 | 385 | 330 | 192 |
| difference ratio PL-D:(%) | 20% | 42% | 23% | 15% | 14% | 12% | 9% | 6% | 5% |
| SF density (ea/wafer) | 12 | 32 | 4 | 5 | 4 | 2 | 1 | 1 | 1 |
| BSF density (ea/wafer) | 13 | 31 | 5 | 5 | 4 | 3 | 2 | 1 | 1 |
| TSD density (ea/cm$^2$) | 65 | 668 | 3 | 4 | 3 | 2 | 2 | 2 | 1 |
| Wafer geometric yield | | | | | | | | | |
| warp (μm) | 76 | 58 | 64 | 32 | 30 | 15 | 10 | 5 | 5 |
| bow (μm) | +/−42 | +/−38 | +/−48 | +/−18 | +/−15 | +/−10 | +/−8 | +/−6 | +/−5 |
| triangle defect (ea/wafer) | 2.5 | 3 | 3.5 | 0.1 | 0.05 | 0.04 | 0.03 | 0.02 | 0.02 |
| evaluation | NG | NG | NG | G | G | G | G | G | G |

As shown in the experimental results in Table 1, when the axial temperature gradient ($\Delta Tz$) is controlled within the range of 20° C./cm to 150° C./cm, the radial temperature gradient ($\Delta Tx$) is controlled within the range of 10° C./cm to 100° C./cm, and when the temperature gradient difference ($\Delta Tz-\Delta Tx$) is controlled within the range of 10° C./cm to 50° C./cm, as shown in Embodiment 1 to Embodiment 6, the silicon carbide wafer may have extremely low defects and achieve better epitaxial quality yield. As shown in the experimental results in Embodiment 1 to Embodiment 6, the warp of the silicon carbide wafer can be less than 40 μm, the bow can be in the range of +/−20 μm, and the triangle defect density can be less than 0.1 pcs/cm$^2$.

In contrast, referring to Control Group 1 and Control Group 2, even if the BPD density of the seed end and the dome end of the wafer are within the range of less than 550 pcs/cm$^2$, the evaluation of the wafer geometric yield is still not good (NG) if the PL-BPD density of the seed end and the dome end of the wafer are not controlled to be less than 2,000 pcs/cm$^2$ at the same time. That is, the warp, bow, and triangle defect density of the silicon carbide wafer cannot be controlled within the ideal range.

In addition, referring to Control Group 3, even if the through-spiral dislocation (TSD) density is controlled to be 5 pcs/cm² or less, the bar stacking fault (BSF) density is controlled to be less than 5 pcs/wafer or less, and the stacking fault (SF) density is controlled to be 5 pcs/cm² or less, the evaluation of the wafer geometric yield is still not good (NG) if the PL-BPD density of the seed end and the dome end of the wafer are not controlled to be less than 2,000 pcs/cm² at the same time. That is, the warp, bow, and triangle defect density of the silicon carbide wafer cannot be controlled within the ideal range.

In summary, by further considering the basal plane dislocation (PL-BPD) density detected by photoluminescence, a more complete analysis of the quality of silicon carbide crystals and wafers can be provided. It is possible to identify the type of silicon carbide crystals and wafers that have extremely low defects, so that the wafer has a better wafer geometric yield. More specifically, the epitaxial quality yield of the silicon carbide wafers screened out by the method of formation of disclosure and the complete analysis of defects of the silicon carbide wafers of the disclosure reaches more than 98%.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A silicon carbide wafer, having a seed end and a dome end opposite to the seed end, wherein
a basal plane dislocation (BPD) density detected by potassium hydroxide (KOH) etching is less than 550 pcs/cm² at both the seed end and the dome end, and
a basal plane dislocation (PL-BPD) density detected by photoluminescence is less than 2000 pcs/cm² at both the seed end and the dome end.

2. The silicon carbide wafer according to claim 1, wherein for the basal plane dislocation (BPD) density detected by potassium hydroxide (KOH) etching, a difference ratio D of a first base plane dislocation density BPD1 at the seed end to a second base plane dislocation density BPD2 at the dome end is required to satisfy the following equation (1):

$$D = (BPD1 - BPD2)/BPD1 \le 26\%. \quad (1)$$

3. The silicon carbide wafer according to claim 1, wherein for the basal plane dislocation (PL-BPD) density detected by photoluminescence, a difference ratio PL-D of a first base plane dislocation density PL-BPD1 at the seed end to a second base plane dislocation density PL-BPD2 at the dome end is required to satisfy the following equation (2):

$$PL - D = (PL - BPD1 - PL - BPD2)/PL - BPD1 \le 16\%. \quad (2)$$

4. The silicon carbide wafer according to claim 3, wherein the difference ratio PL-D of the first base plane dislocation density PL-BPD1 at the seed end to the second base plane dislocation density PL-BPD2 at the dorm end is 14% or less.

5. The silicon carbide wafer according to claim 3, wherein the difference ratio PL-D of the first base plane dislocation density PL-BPD1 at the seed end to the second base plane dislocation density PL-BPD2 at the dorm end is 12% or less.

6. The silicon carbide wafer according to claim 3, wherein the difference ratio PL-D of the first base plane dislocation density PL-BPD1 at the seed end to the second base plane dislocation density PL-BPD2 at the dorm end is 10% or less.

7. The silicon carbide wafer according to claim 1, wherein the basal plane dislocation (BPD) density detected by the potassium hydroxide (KOH) etching is less than 200 pcs/cm² at both the seed end and the dome.

8. The silicon carbide wafer according to claim 1, wherein the basal plane dislocation (PL-BPD) density detected by the photoluminescence is less than 1000 pcs/cm² at both the seed end and the dome end.

9. The silicon carbide wafer according to claim 1, wherein a wafer diameter of the silicon carbide wafer is 150 mm, 200 mm, or 300 mm.

10. The silicon carbide wafer according to claim 1, wherein the silicon carbide wafer has a through-spiral dislocation (TSD) density of 5 pcs/cm² or less, a bar stacking fault (BSF) density of 5 pcs/wafer or less, and a stacking fault (SF) density of 5 pcs/wafer or less.

11. The silicon carbide wafer according to claim 1, wherein a warp of the silicon carbide wafer is less than 40 µm, a bow is within a range of +/−20 µm, and a triangle defect density is less than 0.1 pcs/cm².

12. A method of forming a silicon carbide wafer, comprising:
providing a raw material containing a carbon element and a silicon element and a seed crystal located above the raw material in a reactor;
performing a growth process of silicon carbide crystal, wherein the growth process comprises heating the reactor and the raw material to form a silicon carbide crystal on the seed crystal,
in the growth process, controlling an axial temperature gradient ($\Delta Tz$) of the silicon carbide crystal in a range of 20° C./cm to 150° C./cm, and controlling a radial temperature gradient ($\Delta Tx$) of the silicon carbide crystal in a range of 10° C./cm to 100° C./cm; and
after slicing and polishing the silicon carbide crystal, obtaining a silicon carbide wafer.

13. The method according to claim 12, wherein in the growth process, the axial temperature gradient ($\Delta Tz$) of the silicon carbide crystal is controlled to be in a range of 20° C./cm to 100° C./cm, and the radial temperature gradient ($\Delta Tx$) of the silicon carbide crystal is controlled to be in a range of 10° C./cm to 80° C./cm.

14. The method according to claim 12, wherein a temperature gradient difference ($\Delta Tz - \Delta Tx$) between the axial temperature gradient and the radial temperature gradient of the silicon carbide crystal is in a range of 10° C./cm to 50° C./cm.

* * * * *